US008775979B2

(12) United States Patent
Oberai

(10) Patent No.: US 8,775,979 B2
(45) Date of Patent: Jul. 8, 2014

(54) FAILURE ANALYSIS USING DESIGN RULES

(75) Inventor: Ankush Oberai, Fremont, CA (US)

(73) Assignee: Synopsys. Inc., Mountain View, CA (US)

(*) Notice: Subject to any disclaimer, the term of this patent is extended or adjusted under 35 U.S.C. 154(b) by 157 days.

(21) Appl. No.: 12/985,788

(22) Filed: Jan. 6, 2011

(65) Prior Publication Data

US 2011/0191725 A1 Aug. 4, 2011

Related U.S. Application Data

(60) Provisional application No. 61/299,952, filed on Jan. 30, 2010.

(51) Int. Cl.
*G06F 17/50* (2006.01)
(52) U.S. Cl.
USPC ............. 716/52; 716/50; 716/51; 716/100; 716/106; 716/103
(58) Field of Classification Search
USPC ............... 716/50–52, 100, 103, 106–107, 716/110–112, 118–119, 55, 139
See application file for complete search history.

(56) References Cited

U.S. PATENT DOCUMENTS

| 4,763,289 | A  | * | 8/1988  | Barzilai et al. ............. 703/2   |
|-----------|----|---|---------|---------------------------------------|
| 4,873,647 | A  | * | 10/1989 | Banki et al. ............. 716/102    |
| 5,559,997 | A  | * | 9/1996  | Tsuchida et al. ............. 716/112 |
| 6,219,822 | B1 | * | 4/2001  | Gristede et al. ............. 716/113 |
| 6,275,971 | B1 |   | 8/2001  | Levy                                  |
| 6,449,752 | B1 | * | 9/2002  | Baumgartner et al. ........ 716/106   |
| 6,530,065 | B1 | * | 3/2003  | McDonald et al. ............ 716/102  |
| 6,606,735 | B1 | * | 8/2003  | Richardson et al. .......... 716/112  |
| 6,611,946 | B1 | * | 8/2003  | Richardson et al. .......... 716/112  |
| 6,756,242 | B1 | * | 6/2004  | Regan ............................. 438/14 |
| 6,969,837 | B2 |   | 11/2005 | Ye                                    |
| 7,149,989 | B2 |   | 12/2006 | Lakshmanan et al.                     |
| 7,653,892 | B1 | * | 1/2010  | Gennari et al. ................. 716/50 |
| 7,752,577 | B1 | * | 7/2010  | Gennari et al. ............... 716/122 |
| 7,770,080 | B2 | * | 8/2010  | Blanton et al. ................ 714/723 |
| 7,987,442 | B2 | * | 7/2011  | Rajski et al. .................. 716/136 |
| 2002/0194575 | A1 | * | 12/2002 | Allen et al. ..................... 716/17 |
| 2003/0115569 | A1 | * | 6/2003  | Ikeuchi ........................... 716/19 |
| 2004/0123264 | A1 | * | 6/2004  | Tsai et al. ....................... 716/19 |
| 2006/0036977 | A1 | * | 2/2006  | Cohn et al. ........................ 716/4 |
| 2006/0090146 | A1 | * | 4/2006  | LeBritton et al. ................. 716/4 |

(Continued)

OTHER PUBLICATIONS

"Magma Camelot CAD Navigation Software Adopted by Analytical Solutions for Failure Analysis," Press Release from Sep. 9, 2009.

(Continued)

*Primary Examiner* — Stacy Whitmore
(74) *Attorney, Agent, or Firm* — Adams Intellex, PLC

(57) ABSTRACT

The use of design rule checks for failure analysis of semiconductor chips is described. The smaller geometries of recent semiconductor devices lead to a much higher level of sensitivity of devices to photolithography related systematic problems. Failure analysis to date has focused on physical, randomly distributed defects of devices rather than systematic problems caused by the mask manufacturing or mask application process. Methods and systems are described which allow for online searches of a layout database for geometric features defined by a set of rules. The rules may be defined as two-dimensional Boolean operations including shape or distance based as well as any kind of combination. The result is graphically and interactively presented.

22 Claims, 6 Drawing Sheets

(56) References Cited

U.S. PATENT DOCUMENTS

| | | | |
|---|---|---|---|
| 2007/0157153 A1* | 7/2007 | Croffie et al. | 716/21 |
| 2008/0005704 A1* | 1/2008 | Miloslavsky et al. | 716/2 |
| 2008/0010624 A1* | 1/2008 | Lin et al. | 716/10 |
| 2008/0028345 A1* | 1/2008 | Suri et al. | 716/2 |
| 2008/0092099 A1* | 4/2008 | Lin et al. | 716/8 |
| 2008/0148211 A1* | 6/2008 | Dai et al. | 716/11 |
| 2008/0184178 A1* | 7/2008 | Chang et al. | 716/5 |
| 2008/0250378 A1* | 10/2008 | Chen et al. | 716/16 |
| 2009/0138835 A1* | 5/2009 | Sinha et al. | 716/4 |
| 2009/0172626 A1* | 7/2009 | Pucci et al. | 716/11 |
| 2009/0241087 A1* | 9/2009 | Zhang et al. | 716/21 |
| 2009/0287440 A1 | 11/2009 | Kulkarni | |
| 2009/0300570 A1* | 12/2009 | Chan | 716/11 |
| 2009/0310870 A1 | 12/2009 | Monkowski | |
| 2010/0064269 A1* | 3/2010 | Lai et al. | 716/5 |
| 2010/0153904 A1* | 6/2010 | Zhang | 716/21 |
| 2010/0199235 A1* | 8/2010 | El Yahyaoui et al. | 716/2 |
| 2010/0242000 A1* | 9/2010 | Strenski et al. | 716/4 |
| 2010/0287515 A1* | 11/2010 | Hedman et al. | 716/5 |
| 2010/0306720 A1* | 12/2010 | Pikus et al. | 716/5 |
| 2011/0023002 A1* | 1/2011 | Cheng et al. | 716/126 |
| 2011/0107286 A1* | 5/2011 | Batterywala et al. | 716/122 |
| 2011/0167397 A1* | 7/2011 | Huckabay et al. | 716/112 |
| 2013/0305195 A1* | 11/2013 | Robles et al. | 716/52 |

OTHER PUBLICATIONS

"Knights Camelot: Camelot is a next-generation CAD navigation system and key component of Magma's Fab Analysis product line," Jul. 2008.

Inventor affidavit covering experimental use exception dated Sep. 25, 2012.

Inventor affidavit covering use in the United States of America dated Feb. 3, 2013.

* cited by examiner

US 8,775,979 B2

FAILURE ANALYSIS USING DESIGN RULES

RELATED APPLICATIONS

This application claims the benefit of the U.S. provisional patent application "Failure Analysis Using Design Rules" Ser. No. 61/299,952, filed Jan. 30, 2010. The foregoing application is hereby incorporated by reference in its entirety.

FIELD OF INVENTION

This application relates generally to semiconductor failure analysis and more particularly to failure analysis using design rules.

BACKGROUND

Semiconductor chips are vastly complex structures. There are numerous metal lines of miniscule dimension in close proximity to one another. There are diffusions, polysilicon shapes, and insulator layers, all of which need to be fabricated to exacting tolerances. An error in any step of fabrication or the presence of even the smallest defect can cause a failure in the operation of a chip. Failures on semiconductor chips may be the result of random defects or systematic defects on the chips. Design problems with semiconductor devices are traditionally overcome by having layout design rule checks (DRCs) evaluated against a chip layout prior to beginning mask and chip fabrication. With the advent of deep submicron technologies, new fault models are being detected which cannot be covered by traditional design rule checking processes.

There remains a need for an improved failure analysis process.

SUMMARY

Through the use of design rule checks, improved failure analysis of semiconductor chips can be accomplished. A user of a failure analysis tool may take an existing layout database and search the layout for electrical signals which have a suspect relationship with other signals or the surrounding layout shapes. Rules may be defined which can be executed to confirm complex failure models or to find areas of interest defined by complex geometrical constraints. Layout and netlists may each be displayed to aid in failure analysis.

A computer implemented method is disclosed for performing semiconductor failure analysis comprising: importing a semiconductor layout; having a set of rules wherein each rule of the set of rules describes a design rule check for the semiconductor layout; selecting a rule from the set of rules to apply to the semiconductor layout; identifying a portion of the semiconductor layout by searching through the semiconductor layout for a match to the rule which was selected; and displaying the portion of the semiconductor layout. The method may include importing a netlist corresponding to the semiconductor layout. The method may include performing electrical analysis on the netlist. The method may include storing results of the electrical analysis. The method may include displaying waveforms from the electrical analysis. The method may include storing an image of the portion of the semiconductor layout. The method may include importing defect information from a semiconductor fabrication process. The identifying may be accomplished by progressively searching through the semiconductor layout to find a match between the rule and a subset of the semiconductor layout. The rule may describe a two-dimensional Boolean operation on shapes of a layer. The rule may describe a two-dimensional Boolean operation on shapes of a plurality of layers. The rule may describe a two-dimensional Boolean operation on shapes of one or more layers as well as neighboring electrical traces identified from the electrical analysis of the netlist. The rule may describe a two-dimensional Boolean operation on shapes of one or more layers as well as shapes of waveforms resulting from the electrical analysis. The rule may describe a two-dimensional Boolean operation on shapes of one or more layers and shapes of potential defects derived from one of defect scanning tools and yield management systems. The rule may describe one or more of sizing constraints and spacing constraints. The rule may describe shape-oriented operations. The rule may be used to describe a potential defect which is systematic. The method may include providing CAD navigation to the portion of the semiconductor layout. The method may include moving a probing location on a chip to the portion of the semiconductor layout. The set of rules may be created as part of the semiconductor failure analysis. The set of rules may be imported. The set of rules may be defined within an electronic design automation tool.

In some embodiments, a computer program product may be embodied in a non-transitory computer readable medium that, when executed on one or more processors, analyzes semiconductor failures by performing steps of: importing a semiconductor layout; having a set of rules wherein each rule of the set of rules describes a design rule check for the semiconductor layout; selecting a rule from the set of rules to apply to the semiconductor layout; identifying a portion of the semiconductor layout by searching through the semiconductor layout for a match to the rule which was selected; and displaying the portion of the semiconductor layout. In some embodiments, a system for performing semiconductor failure analysis may comprise: a memory for storing instructions; one or more processors attached to the memory wherein the one or more processors are configured to: import a semiconductor layout; have a set of rules wherein each rule of the set of rules describes a design rule check for the semiconductor layout; select a rule from the set of rules to apply to the semiconductor layout; and identify a portion of the semiconductor layout by searching through the semiconductor layout for a match to the rule which was selected; and a display to present the portion of the semiconductor layout.

Other aspects, features, and advantages will be apparent from the following detailed description, the drawings, and the claims.

BRIEF DESCRIPTION OF THE DRAWINGS

The following detailed description of certain embodiments thereof will be understood by reference to the following figures wherein.

DETAILED DESCRIPTION

Figure 1:
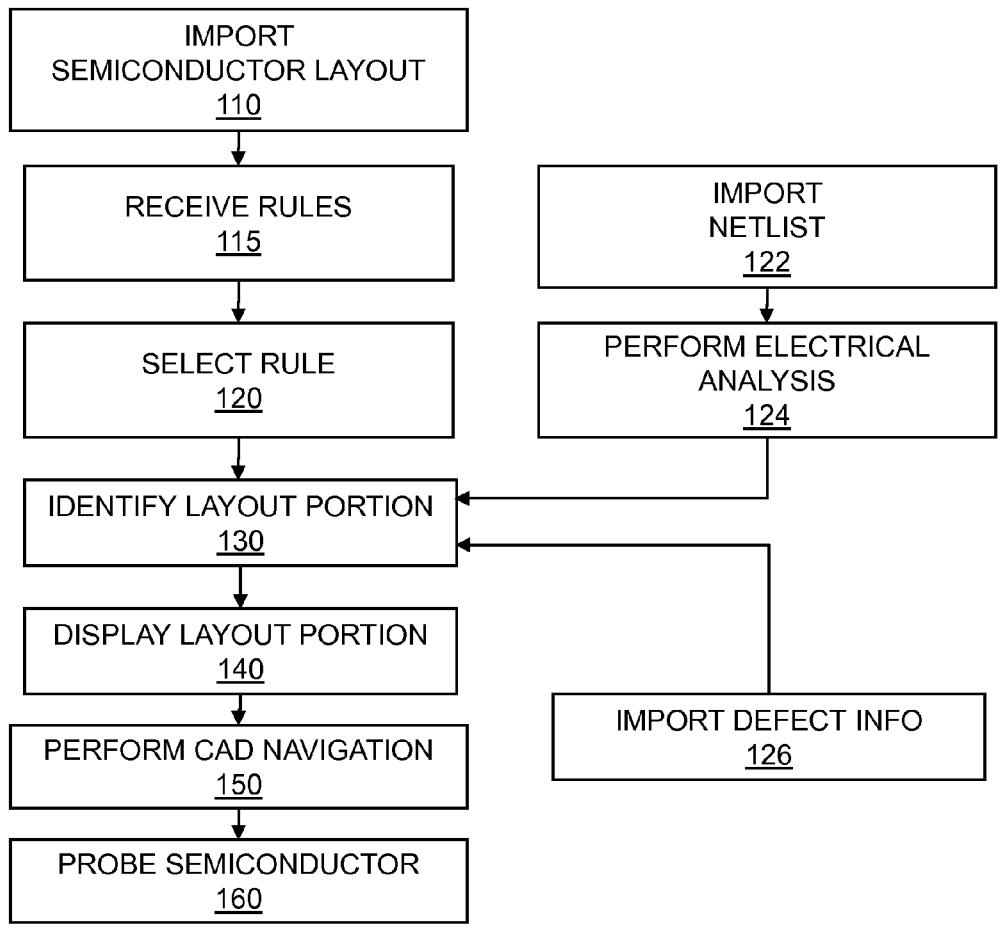
FIG. 1 is a flowchart for performing semiconductor failure analysis using design rule checks.

The present disclosure provides a description of various methods and systems associated with performing semiconductor failure analysis using design rule checks (DRCs). Failure analysis can include evaluation of failing semiconductor devices to determine root cause of failure through examination of the structures and defects on a physical device. Design rule checking can include evaluating semiconductor layout structures for specific patterns where the patterns and key dimensions are defined as rules. Users may create rules to search on specific geometric relationships within semiconductor layout shapes based on electrical signals and possible defect locations. Rules may describe one or more of sizing constraints and spacing constraints. Rules may describe shape-oriented operations.

As semiconductor technologies advance they tend to rely on ever-smaller geometries. Unfortunately, as the geometries become smaller systematic defects in semiconductors tend become increasingly difficult to track down and remedy.

A variety of systematic defects are possible. For example, a systematic defect can be due to polygon design within a layout or due to fabrication where adjacent shapes are regularly produced in an incorrect fashion; a systematic defect may be produced by process and design interactions; and so on. Other systematic defects will be appreciated.

In practice, systematic defects can be subtle and tracking them down can require careful testing. It is therefore desirable to be able to identify systematic defects during failure analysis. In some cases, a systematic defect may only be detectable with a certain arrangement of shapes, such as a group of polygons (or constellation) in the layout. Furthermore, certain arrangements of polygons may be more susceptible to defects and require careful failure analysis based on the layout using.

Traditional design rule checking performs design verification using "pre-silicon" shapes. The pre-silicon shapes are design shapes that may or may not reflect the ultimate fabricated shapes. The fabricated shapes can have foreshortening, rounding, and other modifications that are a function of light waves and the limits of physics and chemistry at the small dimensions on the semiconductor chip.

This application describes a failure analysis technique that analyzes semiconductor layouts using DRCs. An example design rule check (DRC) for one type of systematic defect can include evaluating two adjacent tracks to ensure that they are not closer than a certain specified value. In embodiments, a design rule may be created to identify a certain arrangement of polygons and then checked against the remainder of the semiconductor layout to identify other defect sensitive sites. The design rule may be used to describe a potential defect that is systematic. A variety of design rules will be appreciated.

Some embodiments of the failure analysis design rule checking described in this application include analysis with the pre-silicon shapes. Some embodiments include the pre-silicon shapes along with "post-fabrication" shapes reflecting the shape modifications that occur during fabrication.

In some embodiments defects may modify shapes or hotspots identified with the shapes being modified accordingly. In some embodiments, these post-fabrication shapes may be used in preventive analysis prior to fabrication while the design may still be modified.

FIG. 1 is a flowchart for performing semiconductor failure analysis using design rule checks. A failure analysis process 100 begins with importing the semiconductor layout 110. The layout may be in the form of GDSII or Oasis or some other format for describing various shapes, sizes, and relationships of elements in a semiconductor layout. The layout may be for a semiconductor chip or die. The layout may be imported into a database to be included with other information about the chip.

Rules are received 115, the rules describing design rule checks for manufacturing technology in which a chip is to be fabricated. The rules may include rules describing a design rule check for the layout. In some embodiments, a foundry in which the chip is to be fabricated may provide the rules. In some embodiments, the rules may be generated as part of the failure analysis process 100. The rules may describe widths of certain structures on chip, spacings between structures, overlap between one shape and another shape, or any other checks that may help in verifying the layout.

One or more of the rules are selected 120. This may include selecting a rule to apply to the layout. The rule may be selected in an automated fashion or may be specifically chosen by a user to perform a specific failure analysis. In some embodiments, a rule may be recommended by a foundry as pertinent to failure analysis due to, for example, recent fabrication experience, returns from the field where a number of failures were encountered, and so on.

A netlist may be imported 122. The netlist may correspond to the layout. The netlist may describe electrical components that make up the chip. The components may include inverter, AND, OR, NAND, NOR, XOR, XNOR, MUX, and other types of logical gates. The components may include multipliers, adders, ALUs, processors, cores, and other portions of logic. The netlist may include a description of interconnections between the various components as well as individual transistors. The netlist may further include information on the components including size, delay, power, and other characteristics.

An electrical analysis may be performed on the netlist 124. The electrical analysis may include determining electrical connectivity, delay, power, timings, or other aspects related to the operation of the semiconductor chip. In embodiments, electrical analysis may include analyzing the relationship of electrical signals to each other or to surrounding passive structures. The analysis may allow failure analysis personnel to access the layout and search within an area of interest for special geometric relationships between shapes on various layers. The failure analysis process 100 may include online searches of a layout database for geometric features defined by a set of rules. The impact of defects from a manufacturing process on electrical signals may be analyzed along with the impact on operation. In some embodiments, importing the netlist 122 or performing electrical analysis 124 can be omitted without diverging from the scope of this disclosure. It will be appreciated that the process 100 may include storing the results of the electrical analysis, displaying waveforms from the electrical analysis, and so on.

A portion of the layout is identified by searching through the semiconductor layout for a match to the rule that was selected 130. The portion of the layout may be identified based on the layout itself along with the rule that was selected. In some embodiments, the portion of the layout is identified based on the layout, the electrical analysis, the rule that was selected, and so on.

The portion of the layout may be identified by searching through the whole layout for a match to the DRC corresponding to the rule that was selected. In some embodiments, a section of the layout is used as a starting point for searching for a match to the rule that was selected. The section may be chosen based on a history of failures or some other focused concern. There may be failures in a specific group of components or portion of a semiconductor chip where a selected rule may be applied against that section of the layout. The identifying may be accomplished by progressively searching through the semiconductor layout to find a match between the rule and a subset of the semiconductor layout. The subset may include the entire chip or any portion of the chip.

The design rule checking may describe a two-dimensional Boolean operation on shapes of a layer. Two-dimensional Boolean checking may be a combination of two or more rules to filter out and find a desired shape, area, or polygon in the layout.

Two-dimensional Boolean checking may allow for creating complex search criteria based on different parameters. For example, two-dimensional Boolean checking may allow for finding a particular polygon or pattern by using two rules. One rule may be for filtering polygons that meet a certain width criteria. A second rule may check for overlap to narrow the search results to the desired criteria.

A search may alternatively be based on two-dimensional Boolean operations on shapes on differing layers. A search may be based on two-dimensional Boolean operations on shapes on one or more layers and based on the shapes of certain electrical signal wires. A search may be based on two-dimensional Boolean operations on shapes on one or more layers and based on defect shapes derived from defect scanning tools. Defect shapes may also be derived from yield management systems. Searching may be based on size or spacing constraints. Searching may be based on shape-oriented operations.

A two-dimensional Boolean operation may include accomplishing two rule checks as part of a search. For example, two rule checks might include a check for a metal width and a check for a metal extension beyond a via. For another example, two rule checks might include a polysilicon width and an extension of the polysilicon shape past the end of a diffusion.

A rule may describe a two-dimensional Boolean operation on shapes of a plurality of layers. A rule may describe a two-dimensional Boolean operation on shapes of one or more layers as well as neighboring electrical traces identified from the electrical analysis of the netlist. A rule may describe a two-dimensional Boolean operation on shapes of one or more layers as well as shapes of waveforms resulting from the electrical analysis. A rule may describe a two-dimensional Boolean operation on shapes of one or more layers and shapes of potential defects derived from one of defect scanning tools and yield management systems.

Defect information may be imported from a semiconductor fabrication process 126. The defect information may include the size, the type, the level in the fabrication process at which a defect appears, and other aspects about the defect. The defect information may be obtained from the foundry, a third party analyst, or the like. Further, the defect information may be based on experience with previous technologies and so on. In some embodiments a portion of the layout may be identified based on a rule that is selected 120 and based on the defect information that was imported 126.

A portion of the semiconductor layout may be displayed 140. It will be appreciated that a variety of graphical user interface techniques (e.g., highlighting, color emphasis, zoom, etc.) can be applied to the portion of the layout as displayed. It will be further appreciated that the any and all of the portion of the layout as displayed can be stored to a computer-readable medium.

Computer Aided Design (CAD) navigation to the portion of the layout as displayed may be provided 150. The CAD navigation may involve movement of a wafer or a test head so that analysis is done at a desired location on the semiconductor device. The CAD navigation may be used with a piece of test equipment where a wafer or chip is moved to a location where the layout that was identified is observed under a microscope.

The semiconductor chip may be probed 160, for example, by moving a probing location on a chip to the portion of the semiconductor layout. Based on the layout portion which was identified a possible defect site may be determined. A tester may use CAD navigation to move the tester to the portion of the layout that was identified. The portion of the layout may be probed by electrical probing with metal connectors, electron beam probing, laser probing, or other type of probing.

Figure 2:
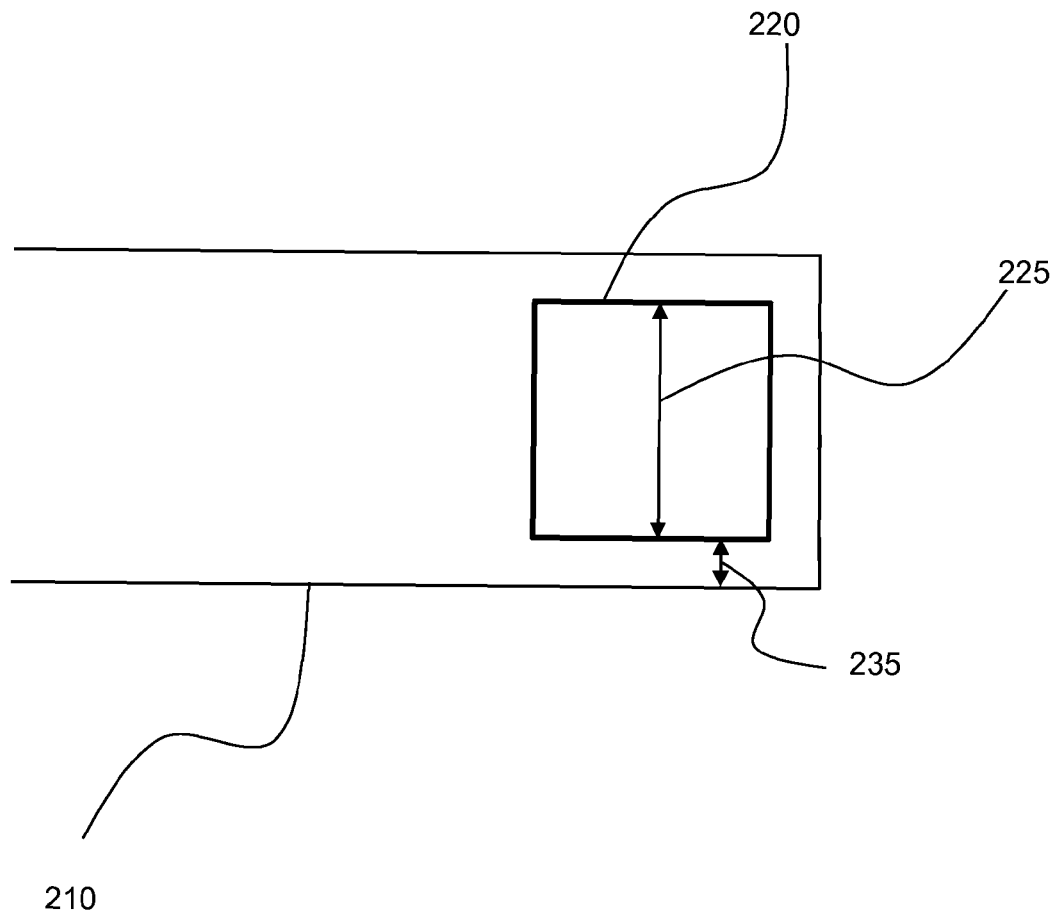
FIG. 2 is an example diagram of a layout portion on which design rule checks can be performed.

FIG. 2 is an example diagram of a layout portion on which design rule checks can be performed. In this exemplary diagram metal line 210 has a via 220 which provides electrical connection to the next layer of metal line. The via 220 may be required to have a width 225 and be verified by a DRC. An example via width is 100 nm. The metal line 210 may be required to have an extension 235 of a specified value and may be verified by a DRC. An example extension is 10 nm. Numerous other types of DRCs exist including diffusion-to-diffusion spacings, contact areas, minimum metal-to-metal spacings, dog-bone end sizing requirements on polysilicon shapes, via adjacency requirements, and so forth. Numerous DRCs may be used to aid failure analysis.

Figure 3:
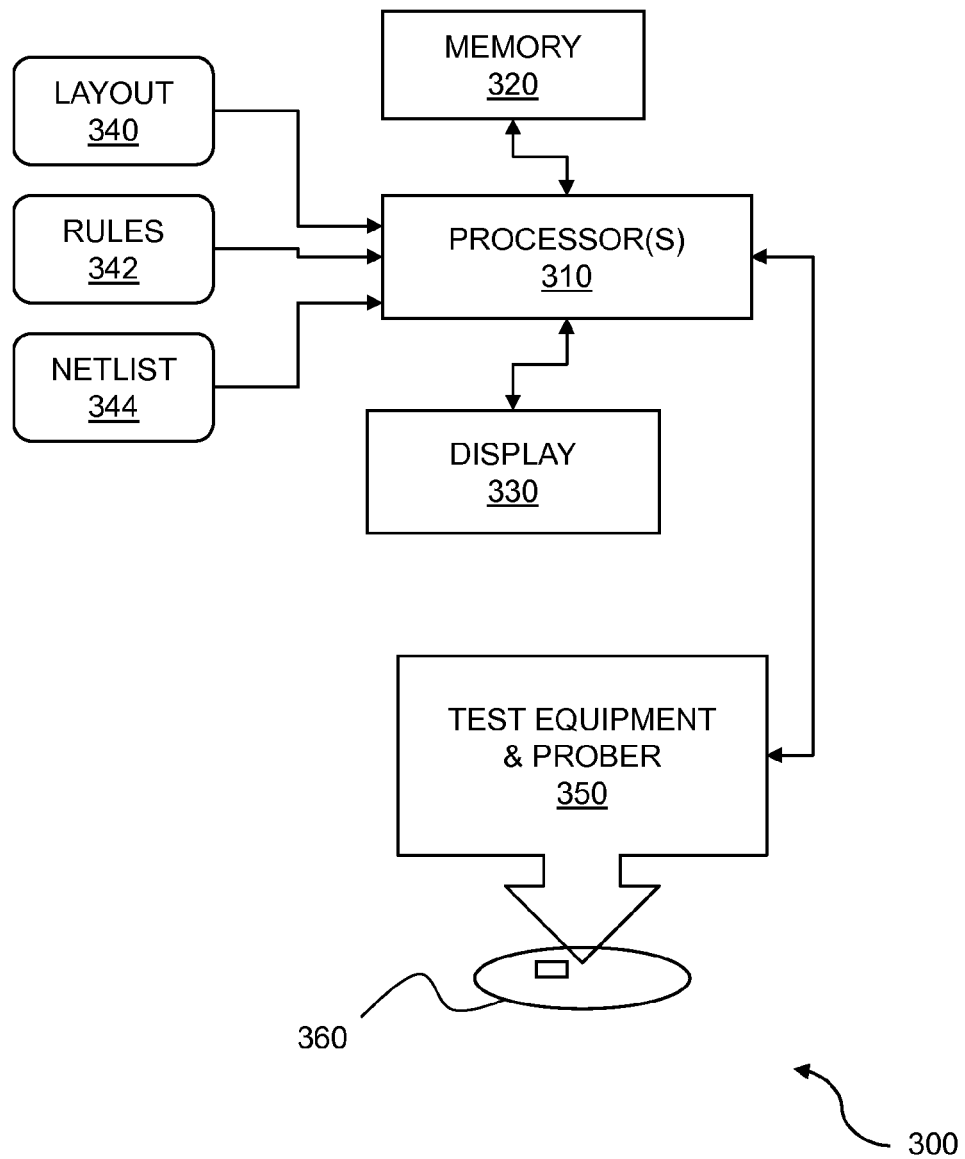
FIG. 3 is a diagram of a system for performing semiconductor failure analysis using design rule checks.

FIG. 3 is a diagram of a system 300 for performing semiconductor failure analysis using design rule checks. One or more processors 310 may communicate with memory 320. The memory 320 may store data on the layout, rules, netlist, and other aspects of the semiconductor. The memory 320 may store instructions for performing the failure analysis, for displaying information on defects, for operating tester equipment, and so on. The processor 310 may render information on a display 330. The display may be used to show the layout and images of the semiconductor chip along with defect information and other information for performing failure analysis.

The processor 310 may read in layout information 340 about the semiconductor chip. The layout information 340 may include design dimensions and associated shapes. The layout information 340 may include modified shapes to aid in fabrication such as optical proximity correction (OPC) shapes. The layout information 340 may include information on post-fabrication shapes. Other layout information will be appreciated for various purposes.

The processor 310 may read in rules 342 such as design rule checks used to aid in failure analysis. The rules 342 may help to identify regions of layout that may be of concern for random defects or for systematic defects. The processor 310 may analyze the layout 340 in light of the rules 342 to identify layout portions for further failure analysis.

The processor 310 may read in netlist information 344 about the semiconductor chip. The netlist 344 may be used with the layout 340 along with the rules 342 to identify portions of the chip for failure analysis.

The processor may interact with the test equipment and prober 350. The test equipment 350 may include an optical or scanning electron microscope, a wafer or chip stage, electrical stimulus and power supply capability, and electrical or contactless probing apparatus. The test equipment 350 may move over wafer 360 via CAD navigation. The test equipment 350 may probe the wafer 360 or a chip at the correct point to perform failure analysis and identify a defect.

Figure 4:
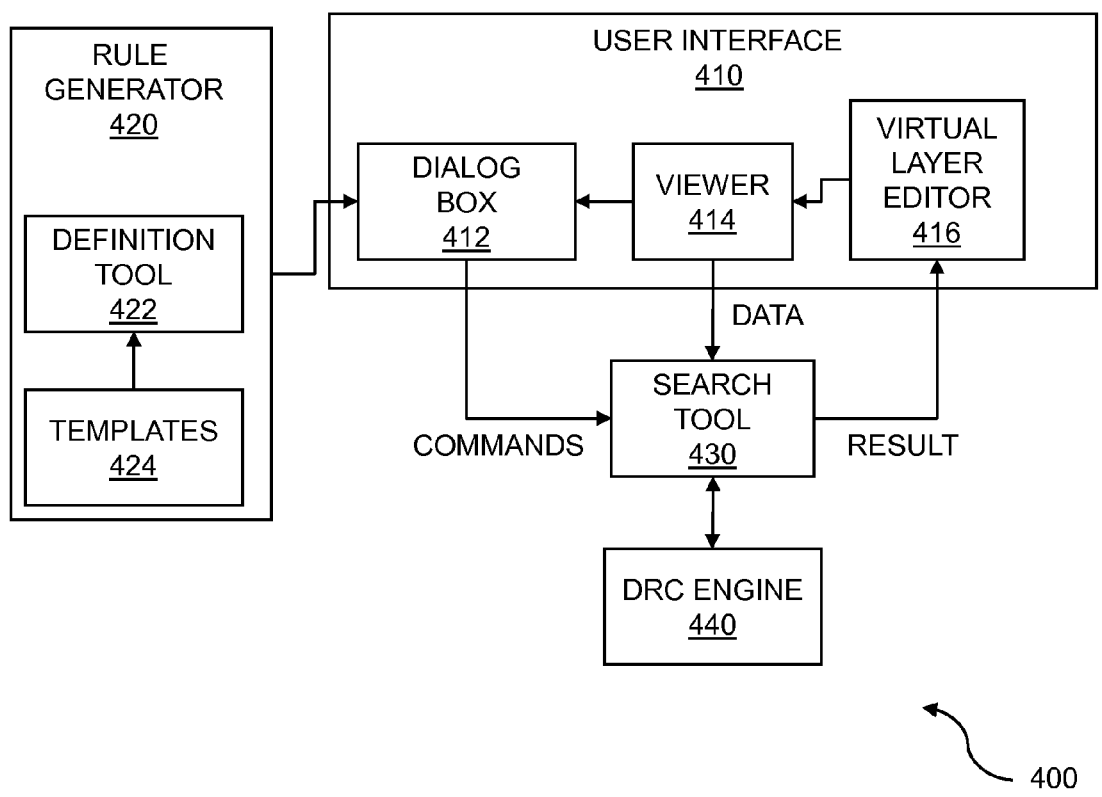
FIG. 4 is a diagram of a failure analysis system with a design rule check engine.

FIG. 4 is a diagram of a failure analysis system with a design rule check engine. The failure analysis system 400 includes a user interface 410, a rule generator 420, a search tool 430, and a DRC engine 440. Within the rule generator 420, templates 424 may reside which can be used to define rules that are desired by a user during failure analysis. The rule generator 420 may use one or more templates 424 in a definition tool 422. The definition tool 422 may provide rules to the user interface 410. A template may filter and identify certain layers or certain dimensions of concern. Rules may be generated during the failure analysis process that match certain templates. A set of rules may be created as part of the semiconductor failure analysis. In some embodiments, the rules may be imported or may be provided by a foundry, an analysis party, or some other third party.

The user interface 410 may include a dialog box, a viewer 414, and a virtual layer editor 416. A dialog box 412 may allow reading in of various rules. The dialog box 412 may also prompt the user to provide information and create rules for failure analysis using the rule generator 420. The dialog box 412 may be used to select one or more rules for use in analysis of a layout. The dialog box 412 may capture commands that are fed to the search tool 430.

The search tool 450 allows for searching across a semiconductor layout using one or more rules. The search tool 430 uses a DRC engine 440 to exercise the rules that were selected in the dialog box 412 to search through the layout. The search tool 430 finds matches in the layout with the selected rules.

A virtual layer editor 416 captures the portion of the layout that was identified by the search tool 430. The virtual layer editor 416 may be used to exchange information about features in the layout. The virtual layer editor 416 may add layers to the layout. These added layers do not reflect any physical design shapes but are instead virtual layers that can help identify areas of concern to designers and failure analysis engineers. The virtual layers can be used to draw geometric shapes, add text, or incorporate lines to annotate the layout. Among other items that may be incorporated are locations for focused ion beam modifications such as probe points, added signal wires, or metallization removal areas. The layout portion where the virtual layers are added may be displayed through the viewer 414. Data from the viewer 414 may be fed back to the search tool 430 to refine the search. The viewer 414 provides location and other information into the dialog box 412. The dialog box 412 can capture instructions to modify the search parameters or move locations on the semiconductor device for further searching by the search tool 430.

Figure 5:
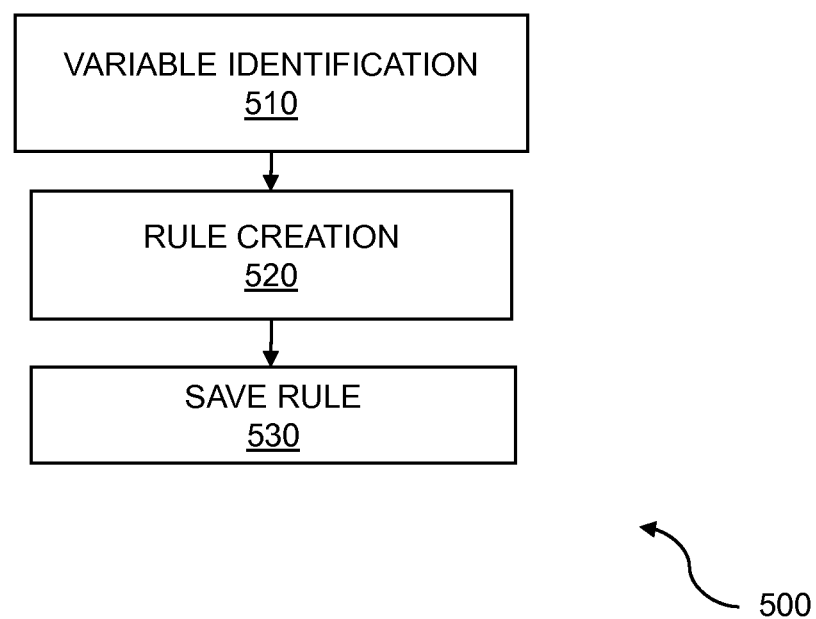
FIG. 5 is a flowchart for design rule check creation.

FIG. 5 is a flowchart for design rule check creation. The process 500 begins with identifying one or more variables 510. The variables relate to the layers for which the rule is being created. The variables may include information on widths, spacings, shapes, and other aspects of a possible rule.

A rule is created 520. The rule may include a specific dimension for a width of a shape. The rule may include a dimension for a space between shapes. The shapes may be on the same or different levels. A rule may identify one or more layers. A rule may identify layout shapes for which to search. In some embodiments, rules identify certain electrical structures and their associated layout shapes for which to search. The rules may have been imported or may have been created by the failure analysis software. The rules may have been obtained from a foundry, from a fabrication analysis team, or from experience based on previous failure analysis and manufacturing defects. The rule is saved 530 for future use or documentation purposes.

Figure 6:
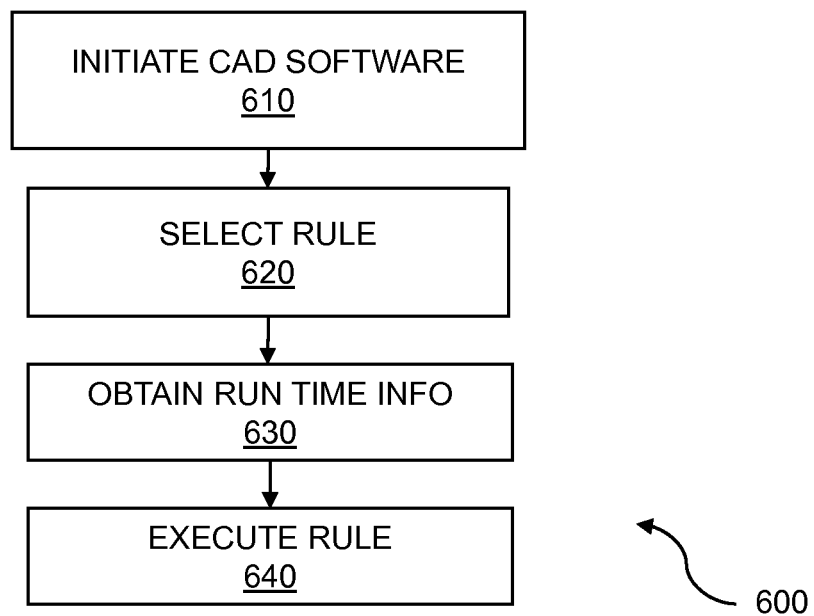
FIG. 6 is a flowchart for design rule check execution.

FIG. 6 is a flowchart for design rule check execution. The process 600 begins with initiation of the CAD software 610. This software may be used for CAD purposes, for failure analysis purposes, or be part of some larger electronic design automation (EDA) package. Initiating the software may include opening or loading the semiconductor layout.

The rule is selected 620. The rule may identify one or more layers. The rule may identify layout shapes for which to search. The rule may identify certain electrical structures and their associated layout shapes to search. The rule may have been imported or may have been created by the failure analysis software. The rule may have been obtained from a foundry, from a fabrication analysis team, or from experience based on previous failure analysis and manufacturing defects.

Run time information is obtained 630. The run time information may include instructions on the specific processors on which to execute.

The rule is executed against the semiconductor layout 640. The rule may be used to search for a portion of the layout that matches the rule. This portion of the layout may be displayed on a layout editor or viewing tool.

Each of the above methods may be executed on one or more processors on one or more computer systems. Embodiments may include various forms of distributed computing and client/server computing. Further, it will be understood that for each flow chart in this disclosure, the depicted steps or boxes are provided for purposes of illustration and explanation only. The steps may be modified, omitted, or re-ordered and other steps may be added without departing from the scope of this disclosure. Further, each step may contain one or more sub-steps. While the foregoing drawings and description set forth functional aspects of the disclosed systems, no particular arrangement of software and/or hardware for implementing these functional aspects should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. Each element of the block diagrams and flowchart illustrations, as well as each respective combination of elements in the block diagrams and flowchart illustrations, illustrates a function, step or group of steps of the methods, apparatus, systems, computer program products and/or computer-implemented methods. Any and all such functions may be implemented by computer program instructions, by special-purpose hardware-based computer systems, by combinations of special purpose hardware and computer instructions, by combinations of general purpose hardware and computer instructions, by a computer system, and so on. Any and all of which may be generally referred to herein as a "circuit," "module," or "system."

A programmable apparatus which executes any of the above mentioned computer program products or computer implemented methods may include one or more processors, microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are not limited to applications involving conventional computer programs or programmable apparatus that run them. It is contemplated, for example, that embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized. The computer readable medium may be a non-transitory computer readable medium for storage. A computer readable storage medium may be electronic, magnetic, optical, electromagnetic, infrared, semiconductor, or any suitable combination of the foregoing. Further computer readable storage medium examples may include an electrical connection having one or more wires, a portable computer diskette, a hard disk, a random access memory (RAM), a read-only memory (ROM), an erasable programmable read-only memory (EPROM), Flash, MRAM, FeRAM, phase change memory, an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed more or less simultaneously to enhance utilization of the processor and to facilitate substantially simultaneous functions. By way of implementation, any and all methods, program codes, program instructions, and the like described herein may be implemented in one or more thread. Each thread may spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the entity causing the step to be performed.

While the invention has been disclosed in connection with preferred embodiments shown and described in detail, various modifications and improvements thereon will become readily apparent to those skilled in the art. Accordingly, the spirit and scope of the present invention is not to be limited by the foregoing examples, but is to be understood in the broadest sense allowable by law.

What is claimed is:

1. A computer implemented method for performing semiconductor analysis comprising:
   performing semiconductor failure analysis comprising:
      importing a semiconductor layout and a netlist corresponding to the semiconductor layout;
      having a set of rules wherein each rule of the set of rules describes a design rule check for the semiconductor layout;
      selecting a rule from the set of rules to apply to the semiconductor layout wherein the rule describes a two-dimensional Boolean operation on shapes where the rule further describes the shapes of one or more layers;
      identifying a portion of the semiconductor layout by searching through the semiconductor layout for a match to the rule which was selected;
      performing electrical analysis on the netlist where the rule further describes shapes of waveforms resulting from the electrical analysis; and
      displaying the portion of the semiconductor layout.

2. The method of claim 1 further comprising storing results of the electrical analysis.

3. The method of claim 1 further comprising importing defect information from a semiconductor fabrication process.

4. The method of claim 1 wherein the identifying is accomplished by progressively searching through the semiconductor layout to find a match between the rule and a subset of the semiconductor layout.

5. The method of claim 1 wherein the shapes are shapes on one layer.

6. The method of claim 1 wherein the shapes are shapes on a plurality of layers.

7. The method of claim 1 wherein the rule further describes the shapes of one or more layers as well as neighboring electrical traces identified from the electrical analysis of the netlist.

8. The method of claim 1 wherein the rule further describes the shapes of one or more layers and shapes of potential defects derived from one of defect scanning tools and yield management systems.

9. The method of claim 1 wherein the rule describes one or more of sizing constraints and spacing constraints.

10. The method of claim 1 wherein the rule describes shape-oriented operations.

11. The method of claim 1 wherein the rule is used to describe a potential defect which is systematic.

12. The method of claim 1 further comprising providing CAD navigation to the portion of the semiconductor layout.

13. The method of claim 1 further comprising moving a probing location on a chip to the portion of the semiconductor layout.

14. The method of claim 1 wherein the set of rules is created as part of the semiconductor failure analysis.

15. The method of claim 1 wherein the set of rules is defined within an electronic design automation tool.

16. A computer program product embodied in a non-transitory computer readable medium that, when executed on one or more processors, analyzes semiconductor failures by performing steps of:

performing semiconductor failure analysis comprising:
- importing a semiconductor layout and a netlist corresponding to the semiconductor layout;
- having a set of rules wherein each rule of the set of rules describes a design rule check for the semiconductor layout;
- selecting a rule from the set of rules to apply to the semiconductor layout wherein the rule describes a two-dimensional Boolean operation on shapes;
- identifying a portion of the semiconductor layout by searching through the semiconductor layout for a match to the rule which was selected where the rule further describes the shapes of one or more layers;
- performing electrical analysis on the netlist where the rule further describes shapes of waveforms resulting from the electrical analysis; and
- displaying the portion of the semiconductor layout.

17. The computer program product of claim 16 that further performs importing defect information from a semiconductor fabrication process.

18. The computer program product of claim 16 wherein the identifying is accomplished by progressively searching through the semiconductor layout to find a match between the rule and a subset of the semiconductor layout.

19. The computer program product of claim 16 that further provides CAD navigation to the portion of the semiconductor layout.

20. The computer program product of claim 16 that further performs moving a probing location on a chip to the portion of the semiconductor layout.

21. A system for performing semiconductor failure analysis comprising:
- a memory for storing instructions;
- one or more processors attached to the memory wherein the one or more processors are configured to:
  - performing semiconductor failure analysis comprising:
    - import a semiconductor layout and a netlist corresponding to the semiconductor layout;
    - have a set of rules wherein each rule of the set of rules describes a design rule check for the semiconductor layout;
    - select a rule from the set of rules to apply to the semiconductor layout wherein the rule describes a two-dimensional Boolean operation on shapes where the rule further describes the shapes of one or more layers; and
    - identify a portion of the semiconductor layout by searching through the semiconductor layout for a match to the rule which was selected;
    - perform electrical analysis on the netlist where the rule further describes shapes of waveforms resulting from the electrical analysis; and
  - a display to present the portion of the semiconductor layout.

22. A computer implemented method for performing semiconductor analysis comprising:
- importing a semiconductor layout and a netlist corresponding to the semiconductor layout;
- using a set of rules to check the semiconductor layout;
- selecting a rule, from the set of rules, to apply to the semiconductor layout wherein the rule describes a two-dimensional spatial relationship for shapes within the semiconductor layout;
- searching through the semiconductor layout for a match to the rule where the rule further describes the shapes of one or more layers;
- identifying, as part of failure analysis, a portion of the semiconductor layout as a result of the searching;
- performing electrical analysis on the netlist where the rule further describes shapes of waveforms resulting from the electrical analysis; and
- displaying the portion of the semiconductor layout.

* * * * *